United States Patent [19]

Tränkle et al.

[11] Patent Number: 4,931,746
[45] Date of Patent: Jun. 5, 1990

[54] CONTROLLABLE BROADBAND AMPLIFIER AND MIXER WHICH INCLUDES THE AMPLIFIER

[75] Inventors: Günther Tränkle, Neu-Ulm Pfuhl; Gottfried Deckenbach, Blaustein, both of Fed. Rep. of Germany

[73] Assignee: Licentia Patent-Verwaltungs-GmbH, Frankfurt, Fed. Rep. of Germany

[21] Appl. No.: 352,546

[22] Filed: May 9, 1989

[30] Foreign Application Priority Data

May 11, 1988 [DE] Fed. Rep. of Germany ......... 381075

[51] Int. Cl.$^5$ ............................ H03F 3/45; H04B 1/28
[52] U.S. Cl. .................................... 330/254; 307/529; 455/333
[58] Field of Search .................. 330/254; 307/529; 328/158, 160; 455/313, 332, 333

[56] References Cited

FOREIGN PATENT DOCUMENTS 19208 9/1986 Japan .................................... 330/254

*Primary Examiner*—James B. Mullins
*Attorney, Agent, or Firm*—Spencer & Frank

[57] ABSTRACT

A controllable broadband amplifier whose current consumption and direct voltage output level are independent of the control voltage includes four differential amplifiers, each having two input ports, two output ports, and a shared port. The two input ports of the first differential amplifier are connected to the two signal input ports of the broadband amplifier, the shared port of the first differential amplifier is connected to the power supply port via a constant current source, and the output ports of the first differential amplifier are connected to the shared ports of the second and third differential amplifiers. The input ports of the second and third differential amplifiers are connected together and to control voltage input ports of the broadband amplifier. One output port of the second differential amplifier is connected to one output port of the third differential amplifier, and both are connected to the shared port of the fourth differential amplifier. The remaining output ports of the second and third differential amplifiers are connected, at respective connection points, to the output ports of the fourth differential amplifier. A network which includes resistors is connected between these connection points, and the input ports of the fourth differential amplifier are connected to one another and to the network. One or both of the connection points can be employed as the signal output port of the broadband amplifier. The connection points are connected to another power supply port via resistors or a mixer stage.

15 Claims, 7 Drawing Sheets

4,931,746

CONTROLLABLE BROADBAND AMPLIFIER AND MIXER WHICH INCLUDES THE AMPLIFIER

CROSS REFERENCE TO RELATED APPLICATION(S)

This application claims the priority of application Ser. No. P 38 16 075.7, filed May 11th, 1988 in the Federal Republic of Germany, the subject matter of which is incorporated herein by reference.

BACKGROUND OF THE INVENTION

The present invention relates to a gain controllable broadband amplifier. More particularly, the present invention relates to a broadband amplifier of the type which includes four differential amplifiers, each having two input ports, two output ports, and a shared port. The broadband amplifier itself has two signal input ports, two control voltage input ports, and two power supply ports. The two input ports of the first differential amplifier are connected to the two signal input ports of the broadband amplifier. The shared port of the first differential amplifier is connected, by way of a constant current source, with one of the power supply ports of the broadband amplifier. One output port of the first differential amplifier is connected to the shared port of the second differential amplifier and the other output port of the first differential amplifier is connected to the shared port of the third differential amplifier. One input port of the second differential amplifier is connected to one input port of the third differential amplifier, and both are connected to one of the control voltage input ports of the broadband amplifier. Furthermore, one of the output ports of the second differential amplifier is connected to one of the output ports of the third differential amplifier, and both are connected to the shared port of the fourth differential amplifier. The remaining output ports of the second and third differential amplifiers are respectively connected to the signal output ports of the broadband amplifier via connecting points and to the remaining power supply port of the broadband amplifier via a signal feed-out stage. Finally, in a conventional broadband amplifier of this type, the two input ports of the fourth differential amplifier are connected together and to a further voltage source.

Such a broadband amplifier is disclosed, for example, in Electronics Letters, Vol. 22, No. 8 (1986), pages 415–516. In contrast to the previously employed amplifier arrangements, in this prior art broadband amplifier the fourth differential amplifier reduces DC voltage fluctuations occurring at the amplifier output during gain control. However, even after this stabilization measure there remains at the output a DC voltage fluctuation of about 12 mV over a control range of 20 dB.

SUMMARY OF THE INVENTION

It is therefore an object of the present invention to provide a controllable broadband amplifier, of the type described above, which has improved stability of its DC voltage level at the amplifier output over a greater control range.

In accordance with the present invention, this object can be attained by using, as the further voltage source connected to the input ports of the fourth differential amplifier, a connection point between two equivalent resistors which are connected in series between the output ports of the second and third differential amplifiers that are not connected together. Further features of the invention can be employed to substantially suppress noise contributions generated during the output stabilization without adversely influencing the cut-off frequency of the broadband amplifier.

The broadband amplifier according to the invention can be used to particular advantage as a transadmittance stage, i.e. as a voltage-current converter, in a mixer cascade composed of a transadmittance stage and a mixer stage, with the output currents of the broadband amplifier constituting the operating currents of the differential amplifiers of the mixer stage. Preferably, the mixer stage is a quadrature mixer stage including two orthogonally driven four-quadrant multipliers. Such a mixer arrangement is distinguished primarily by low current consumption, low noise, high linearity independent of the control voltage, a large dynamic control range, and good backward isolation.

DESCRIPTION OF THE PREFERRED EMBODIMENT

Figure 1:
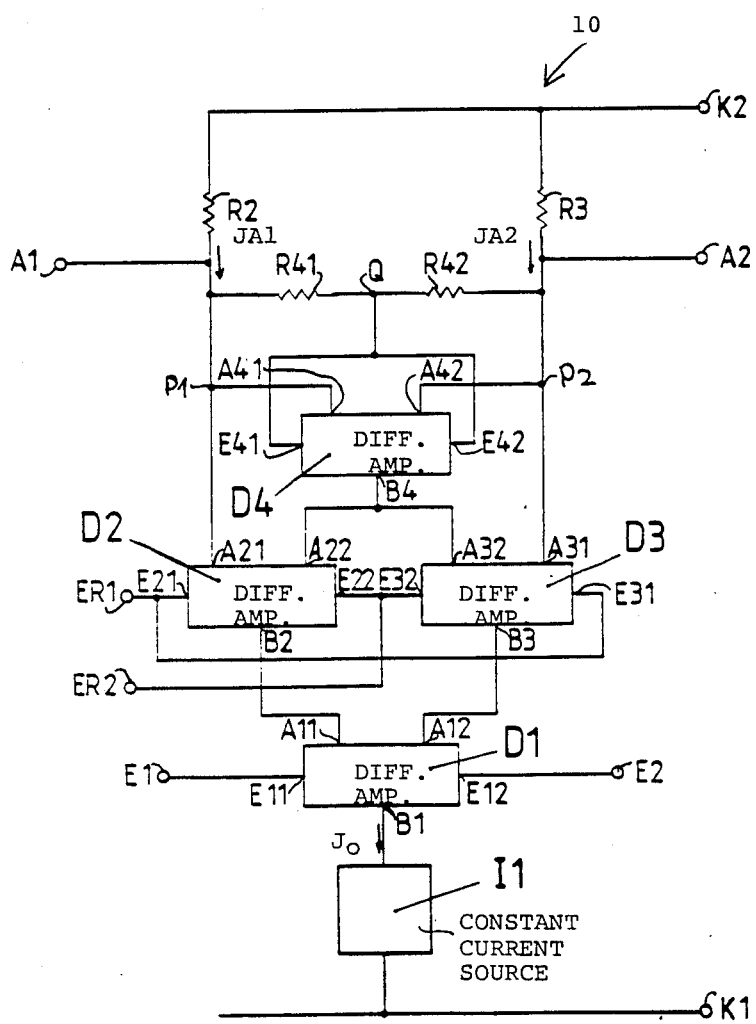
FIG. 1 is a circuit block diagram of an embodiment of a broadband amplifier according to the invention.

FIG. 1 is a circuit block diagram of a controllable broadband amplifier 10 according to the invention. This amplifier includes four differential amplifiers D1, D2, D3, and D4, each having two input ports Eik, two output ports Aik, and a shared port Bi, with i=1, 2, 3 or 4 designating one of the four differential amplifiers and with k=1 or 2 designating the first or second input and output ports. The two input ports E11 and E12 of the first differential amplifier D1 are connected to amplifier input ports E1 and E2 to receive an input signal, e.g. a preamplified rf signal from a receiving antenna. Shared port B1 of differential amplifier D1 is connected, via a constant current source I1, with a power supply port K1 of amplifier 10. Moreover, output port A11 is connected to the shared port B2 of differential amplifier D2 and the other output port A12 is connected to the shared port B3 of differential amplifier D3.

The input ports of differential amplifiers D2 and D3 are connected in parallel and are each connected with a control voltage input port ER1 or ER2, respectively, by which amplifier 10 receives control voltages.

The output port A22 of differential amplifier D2 is connected to output port A32 of differential amplifier D3, and both are connected to shared port B4 of differential amplifier D4. The other output port A21 of differential amplifier D2 is connected at point P1 to output port A41 of differential amplifier D4. Similarly, the remaining output port A31 of differential amplifier D3 is connected at point P2 to output port A42 of differential amplifier D4. By way of resistors R2 and R3, points P1 and P2 are respectively connected with a power supply port K2. Points P1 and P2 are also connected respectively to signal output ports A1 and A2 of the broadband amplifier 10. Resistors R2 and R3 serve as transfer impedances to couple out the signals. Other transfer impedances, a cascade arrangement, a feed-out current mirror or the like could also be employed to couple out the signals.

According to the present invention, two series connected resistors R41 and R42, having the same resistance values (equivalent resistors), are connected between the output ports A21 and A31 of differential amplifiers D2 and D3 that are not connected with one another. The point of connection Q between resistors R41 and R42 is connected with the two input ports E41 and E42 of differential amplifier D3. Resistors R41 and R42 are high-ohmic compared to resistors R2 and R3 and thus have practically no influence on the gain of the broadband amplifier 10.

Current source I1, which is connected between shared port B1 of differential amplifier D1 and power supply port K1, provides a constant current supply Jo for the broadband amplifier 10. Current source I1 may be composed, for example, of a transistor whose emitter-collector path is connected in series with a resistor between ports B1 and K1, the base of the transistor receiving a voltage which controls the current through the emitter-collector path. The current source may of course also be realized as a known current mirror circuit so that the voltage drop across the current source can be kept very low.

If the broadband amplifier 10 is controlled at its control voltage input ports ER1 and ER2 by applying a voltage difference between these ports, the current, for example at output ports A21 and A31 of differential amplifiers D2 and D3, is increased and the current at output ports A22 and A32 is reduced. Due to the fact that output ports A22 and A32 are connected together, the sum current at shared port B4 of differential amplifier D4 (that is, essentially the current into port A41 plus the current into port A42) is dependent only on the voltage difference applied to control voltage input ports ER1 and ER2, and not on the input signal applied to signal input ports E1 and E2. Differential amplifier D4 divides the sum current into two equal components, which are drawn respectively from the current JA1 through resistor R2 and the current JA2 through resistor R3.

An input signal at input signal ports E1 and E2 modulates the operating currents of differential amplifiers D2 and D3 in phase opposition. The currents at output ports A21 and A31 are lower than the currents through shared ports B2 and B3 by a factor set by the voltage difference at control voltage input ports ER1 and ER2. The current through shared port B4 is not modulated by the input signals at input signal ports E1 and E2, and therefore influences only the DC current component in the currents JA1 and JA2 and consequently the DC voltage level at signal output ports A1 and A2. If there is a change in the control voltage, only the AC voltage component at the output ports A1 and A2 is changed, while the DC voltage component remains constant. It is not difficult to keep the fluctuation in the DC voltage level at the signal output ports A1 and A2 lower than 1 mV over a dynamic control range of 50 dB.

Figure 2:
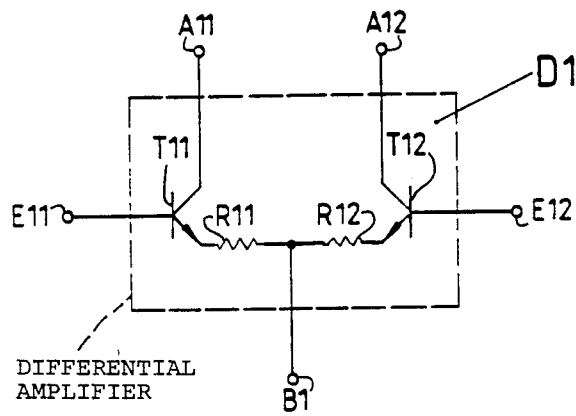
FIG. 2 is a detailed circuit diagram of a differential amplifier employed in the broadband amplifier.

FIG. 2 illustrates a detailed circuit diagram of the differential amplifier D1, for example.

Differential amplifier D1 includes two transistors T11 and T12, whose base terminals provide the two input ports E11 and E12. The collector terminals of transistors T11 and T12 provide the two output ports A11 and A12, and the emitter terminals are interconnected to provide the shared port B1. Differential amplifiers D2 to D4 are constructed and connected in the same manner.

Figure 8:
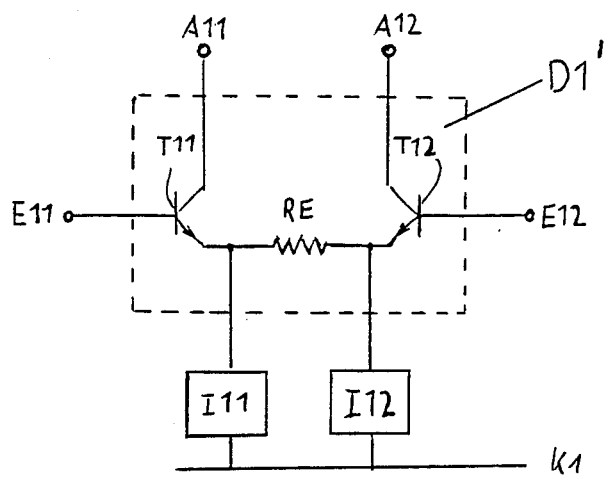
FIG. 8 is a detailed circuit diagram of an alternative embodiment of a differential amplifier

An advantageous modification of the controllable broadband amplifier 10 provides that resistors R11 and R12 are connected into the emitter leads of transistors T11 and T12. In this way, intermodulation distortion of the amplifier is advantageously kept at permissible values independently of the control position. Thus, the broadband amplifier 10 described here combines the advantages of large signal resistivity and DC stabilized outputs almost independent of the control voltage, with simultaneously high gain control range and low noise contributions. As an alternative, the emitters of the two transistors T11 and T12 may be connected to the power supply port K1 via separate current sources I11, I12 and to one another by way of a feedback resistance RE, as shown in FIG. 8 for a differential amplifier D1'. By varying this feedback resistance, the effective feedback and thus linearity and noise can be influenced without any shift in the operating points of the transistors.

By means of corresponding feedback resistors in differential amplifier D4, the uniformity of the current distribution in D4 can be set more easily.

Differential amplifier D4 divides the current through shared port B4 symmetrically and thus furnishes a maximum noise contribution which, according to FIG. 1, acts directly on signal output ports A1 and A2. An advantageous modification of the invention therefore provides measures for the suppression of these noise components.

Figure 3:
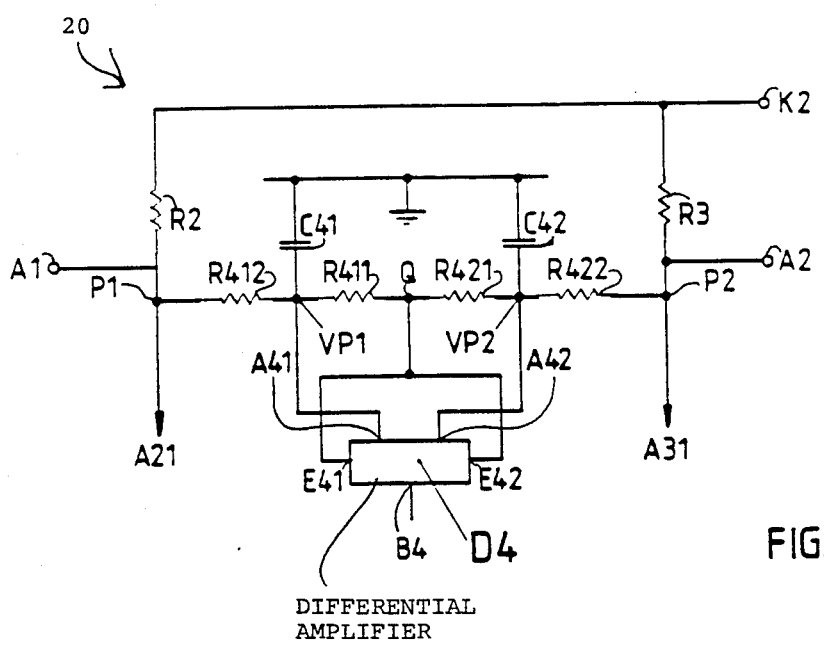
FIG. 3 is a circuit block diagram of a portion of a further embodiment of a broadband amplifier according to the invention, the further embodiment providing an improved signal to noise ratio.

For this purpose, FIG. 3 illustrates a portion of a broadband amplifier 20 in which the resistors R41 and R42 (FIG. 1) are divided into a first pair of resistors R411 and R412 and a second pair of resistors R421 and R422. The connection points VP1 and VP2 are respectively connected to the ground via capacitors C41 and C42. The output port A41 of differential amplifier D4 is connected to connection point VP1, and the output port A42 is connected to connection point VP2. Instead of resistors R412, R422, inductors can advantageously be employed to decouple the noise suppression capacitors C41 and C42 from the signal output ports A1 and A2. Such inductors would then separate the output ports for the amplified input signal frequency in a highly isolated manner from the capacitors C41 and C42, but would not cause a voltage drop for the quiescent current components flowing through differential amplifier D4. The capacitors C41 and C42 are advantageously integrated in the circuit arrangement. They preferably have capacitance values such that the cut-off frequency, which is determined by capacitors C41 and C42 and by the output impedances effective at the transistors of differential amplifier D4, lies clearly below the amplified input signal frequency. If the signals are coupled out symmetrically at output ports A1 and A2, capacitors C41 and C42 can be replaced without adverse consequences by a capacitor connected between points VP1 and VP2.

Figure 4:
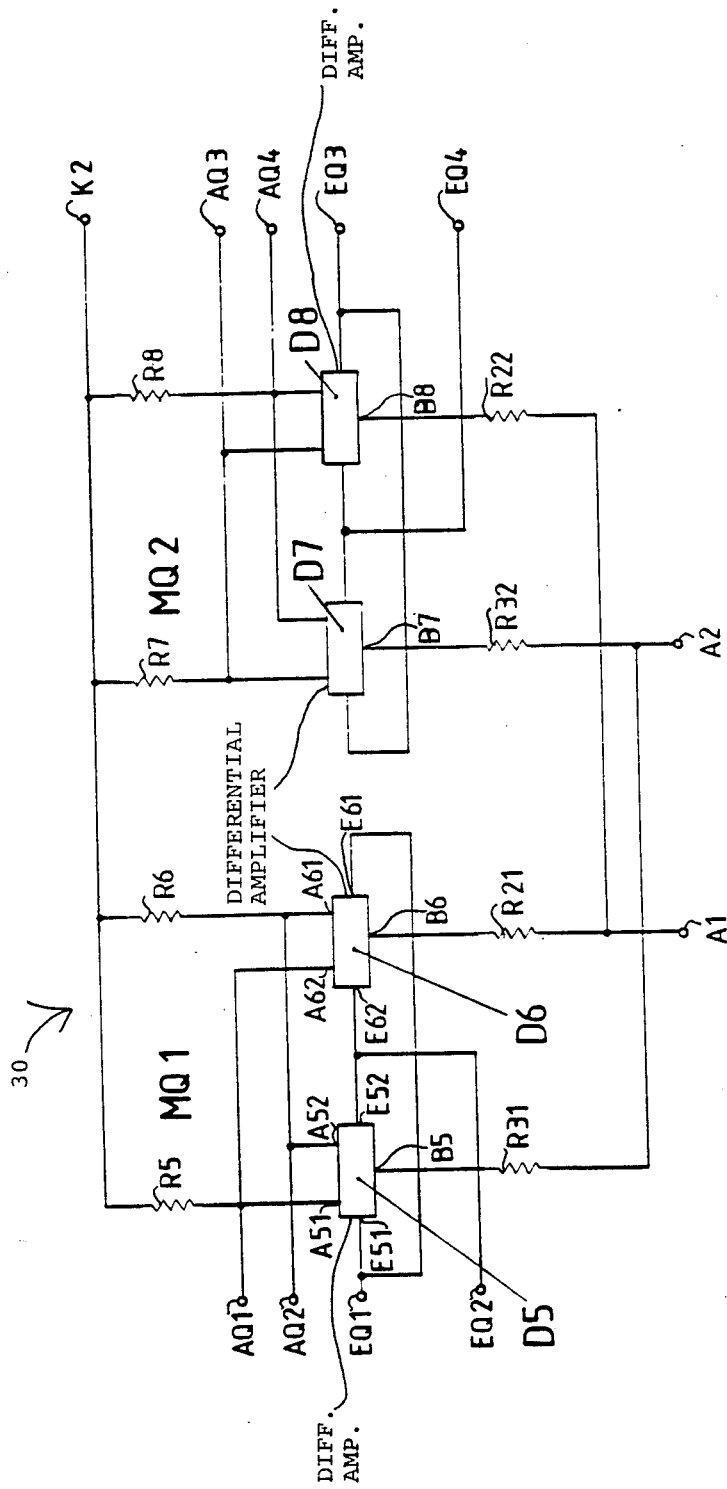
FIG. 4 is a circuit block diagram of a controllable four-quadrant multiplier or, more precisely, two controllable four-quadrant multipliers, which can be used with the broadband amplifier to provide a mixer arrangement in accordance with the present invention.

A controllable broadband amplifier according to the invention can be employed to particular advantage as a voltage/current converter (transadmittance stage) for the input signal in a cascaded mixer arrangement, with the output currents of the amplifier constituting the operating currents of a mixer stage. The cascading of a transadmittance stage with a mixer stage is known per se and is described, for example, in IEEE Journal of Solid-State Circuits, Vol. SC-3, No. 4, December, 1968, pages 365–373. Particularly advantageous arrangements include several separate mixers in the mixer stage, for example, for quadrature mixing of an input signal with two orthogonal heterodyne signals. FIG. 4 shows a mixer stage 30 having two four-quadrant multipliers as mixers MQ1 and MQ2, which each include a quartet of transistors. The transistor quartets are combined into pairs of differential amplifiers whose inputs are connected in parallel and whose outputs are cross-connected. For example the mixer MQ1 includes differential amplifiers D5 and D6. Input ports E51 and E61 are connected to mixer input port EQ1, while input ports E52 and E62 are connected to mixer input port EQ2. The output ports of differential amplifiers D5 and D6 are cross-connected, with output ports A51 and A62 being connected to mixer output port AQ1 and with output ports A52 and A61 being connected to mixer output port AQ2.

The resistors R5 and R6 of mixer MQ1 connect the supply voltage port K2 to mixer output ports AQ1 and AQ2, respectively. Instead of resistors R5 and R6, respectively, a transimpedance, a feed-out current mirror, or a resonant load may be provided. Shared port B5 is connected with signal output port A2 of the broadband amplifier (FIG. 1), and shared port B6 is connected with signal output port A1 of the broadband amplifier. (Resistors R2 and R3 of FIG. 1 are replaced by the mixer stage).

If two mixers MQ1 and MQ2 are employed as a dual-channel multiplier (e.g., a quadrature mixer with an orthogonal driving signal from a local oscillator), decoupling resistors R21, R22, R31, and R32 are preferably employed to improve the current division. All resistors R21, R22, R31 and R32 have the same resistance values.

Figure 5:
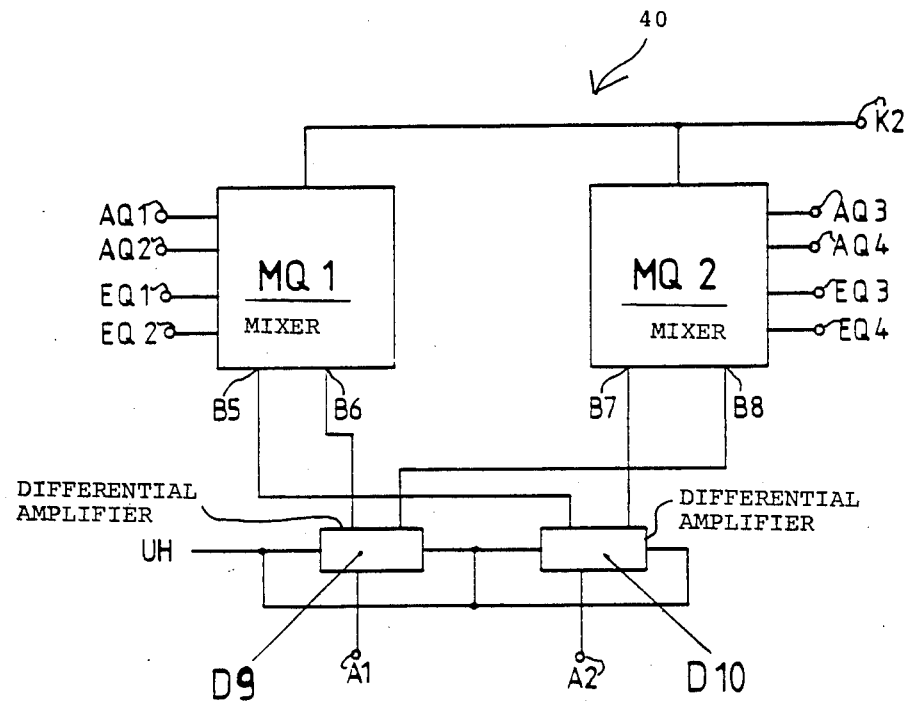
FIG. 5 is a circuit block diagram which is similar to FIG. 4 but which shows the distribution of signals by way of differential amplifiers.

A further improvement in the uniformity of the current distribution between the common voltage/current converter stage (e.g., broadband amplifier 10 of FIG. 1) on the one hand and the two multiplier quartets (e.g., mixers MQ1 and MQ2) on the other hand can be attained using the augmented mixer stage 40 shown in FIG. 5, which additionally includes differential amplifiers D9 and D10 for uniform current distribution. Differential amplifiers D9 and D10 are connected to the mixers MQ1 and MQ2 in lieu of the resistors R21, R22, R31, and R32 of FIG. 4. The input ports of differential amplifiers D9 and D10 are connected to an auxiliary voltage source UH, which is common to all input ports of differential amplifiers D9 and D10 and which is free of interfering voltages. The same terminals as in FIG. 4 bear the same reference numerals in FIG. 5 so that no further explanations are required here.

The mixer stages 30 and 40 of FIGS. 4 and 5, which are known as Gilbert mixers or double balanced mixers, have the particular advantage that the oscillator frequency is already substantially suppressed in the mixer output signals at AQ1, AQ2 and AQ3, AQ4, respectively.

Figure 6:
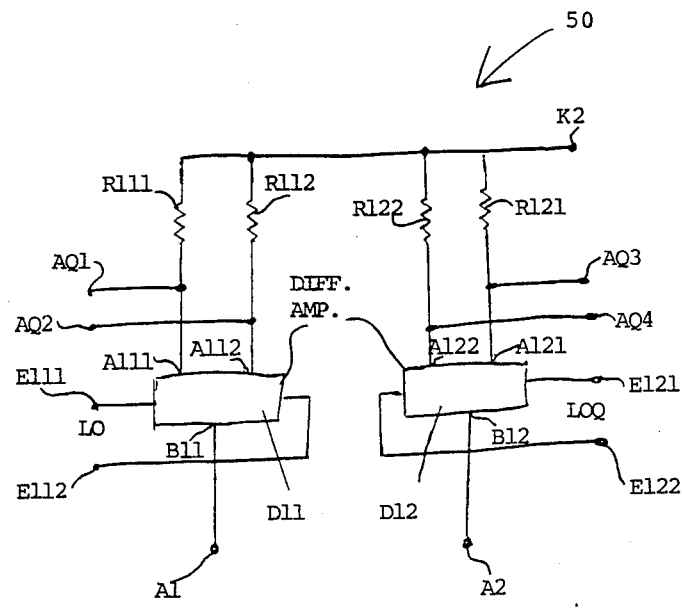
FIG. 6 is a circuit block diagram of a quadrature mixer stage including push-pull mixers.

If the output signals need not meet such a requirement, for example in an arrangement in which the useful signal components in the mixer output signal are filtered out before reaching further active signal processing stages, simpler push-pull mixers may be employed instead of the Gilbert mixers. FIG. 6 illustrates a quadrature mixer stage 50 including two push-pull mixers (differential amplifiers D11 and D12). An oscillator signal LO is present at input ports E111 and E112 of differential amplifier D11. Shared port B11 is connected to one output signal port of the broadband amplifier, e.g., port A1. The shared port B12 of differential amplifier D12 is connected to the other signal output port A2 of the broadband amplifier, and an oscillator signal LOQ (which is orthogonal, or shifted in phase by 90°, with respect to the oscillator signal LO) is present at input ports E121 and E122.

Output ports A111, A112 and A121, A122 of the differential amplifiers D11 and D12 are respectively connected, via impedances R111, R112 and R121, R122, to power supply port K2. Mixer output ports AQ1, AQ2 and AQ3, AQ4, respectively, then provide two output signals which, in addition to the mixed frequency components, also contain signal components of the driving signals. Due to the symmetrical structure and the DC stabilization of the broadband amplifier outputs, the same quiescent current which is independent of the control voltage flows through both differential amplifiers D11 and D12.

For quadrature mixer arrangements, differential amplifiers D5 to D8 and D11, D12, respectively, preferably operate in the switched mode, i.e., with rectangular driving signals, and then furnish a noise contribution which is negligible compared to the remaining components.

Figure 7:
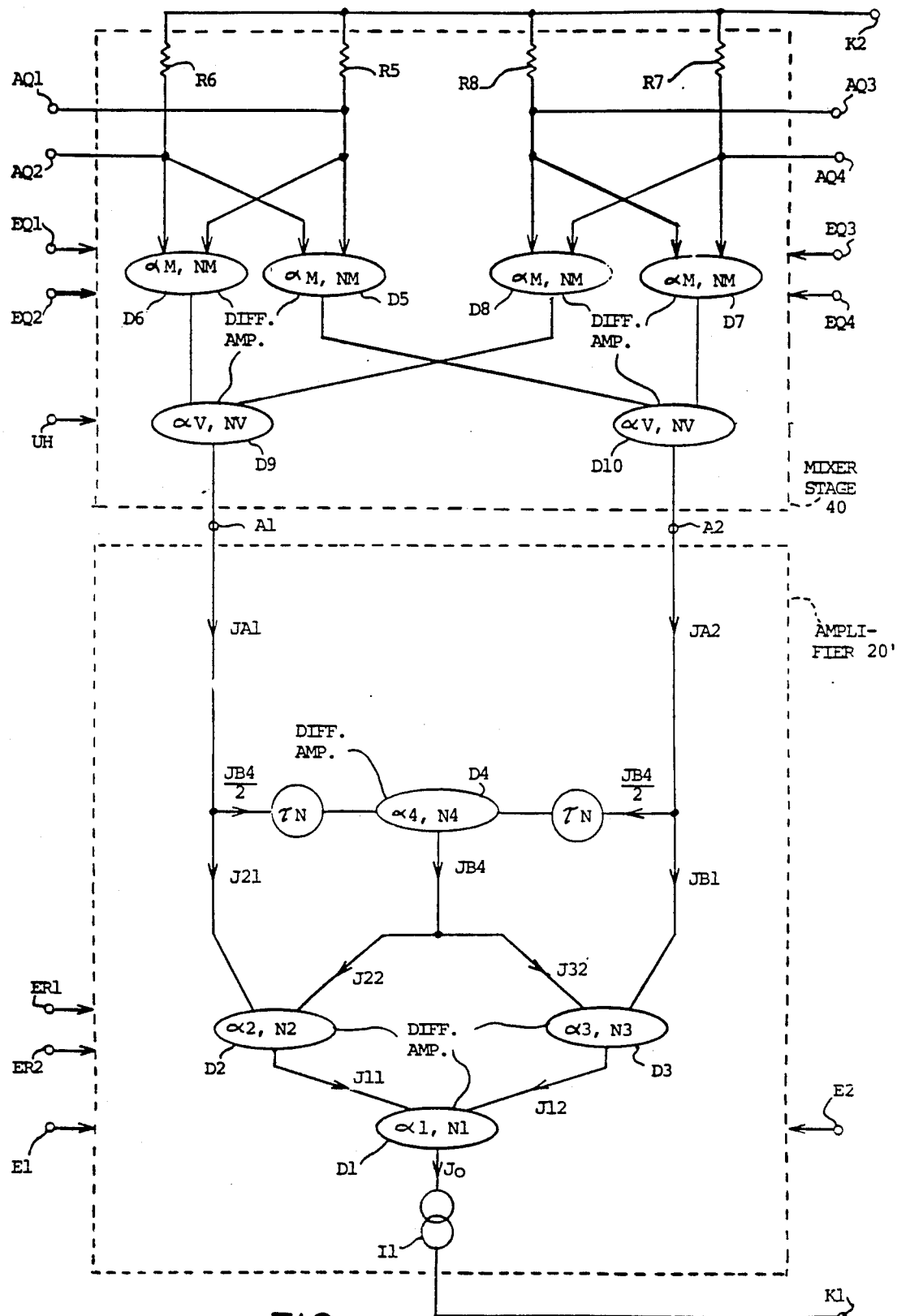
FIG. 7 is a schematic representation of the individual stages of a mixer arrangement.

The entire arrangement of a broadband amplifier and a quadrature switched mixer stage is shown schematically in FIG. 7, which is divided into successive switching stages and which indicates current division ratios (designated by "$\alpha$") and noise contributions (designated by "N") in the individual stages, which are identified using subscripts. In FIG. 7 the quadrature switched mixer stage is the mixer stage 40 of FIG. 5, with the individual mixers MQ1 and MQ2 having the circuitry shown in FIG. 4. Since the connections within stage 40 to mixer input ports EQ1 through EQ4 and to auxiliary voltage source UH will not be pertinent in the following discussion, they are not shown in detail in FIG. 7. The broadband amplifier illustrated in FIG. 7 is a modification of the amplifier 20 illustrated in FIG. 3, with the load resistors R2 and R3 of FIG. 3 being replaced by mixer stage 40. In view of this deviation from FIG. 3, the amplifier is identified in FIG. 7 using reference number 20'. Symbolized by circles are noise filters $\tau N$, which contain resistors R411, R412, R421, R422 and capacitors C41, C42 of the noise suppression arrangement as illustrated in FIG. 3. Additionally, the connections to signal input ports E1 and E2 and to control voltage input ports ER1 and ER2 are not illustrated in detail.

In FIG. 7, differential amplifier D1 provides an input stage which is driven by the high frequency input signal. The input stage divides the constant operating current $J_0$ (determined by current source I1) as a function of the input signal into a first partial current $J_{11} = \alpha_1 . J_0$ at output port A11 (see FIG. 1) and a second partial current $J12=(1-\alpha 1).J_0$ at output port A12 (FIG. 1). The noise contribution N1 of the input stage constitutes the main noise component in the entire arrangement, so that the configuration of the input stage is of decisive significance. The requirements for low noise contribution, high linearity, and low power consumption result in sometimes contradictory tendencies in the determination of individual parameters. For example, high emitter feedback resistances improve linearity characteristics but worsen noise characteristics. A high quiescent current also enhances the linearity characteristics but is disadvantageous with respect to power consumption. The detailed characteristics of the input stage must therefore be adapted to the requirements of each individual case.

In the control stage, which includes the two differential amplifiers D2 and D3, the two partial currents J11 and J12 are divided in the same ratio determined by the control voltage applied to ports ER1 and ER2 into currents $J21=\alpha 2.J11$, $J22=(1-\alpha 2).J11$, $J31=\alpha 3.J12$, and $J32=(1-\alpha 3)J12$, where $\alpha 2=\alpha 3$. From the combination of currents J22 and J32 results a sum current $J2=J22+J32=(1-\alpha 2).J_0$ which is dependent only on the dividing ratio in the control stage and no longer contains any useful signal components (the sum current J2 is not specifically identified in FIG. 7 but is equal to the current JB4). The useful signal components are contained only in the variations in currents J21 and J31, with an amplitude that is weaker than in the currents J11 and J12. The noise contributions N2 and N3 of the control stage depend on the dividing ratio $\alpha 2$ and take on a maximum for $\alpha 2=0.5$, but in any case still lie clearly below the noise contribution N1 of the input stage.

In the stabilization stage, which includes differential amplifier D4, the sum current $JB4=J2$ is fed in equal parts ($\alpha 4=0.5$) to currents J21 and J31 as collector currents and as base currents of differential amplifier D4. Due to the balanced driving of the two transistors of differential amplifier D4 with a common base potential and a common emitter potential, the noise contribution of this differential amplifier reaches a maximum. The noise contribution of differential amplifier D4 can be reduced by enlarging the transistor surfaces and by the thus-attainable lower path resistances of the transistors. However, this also leads to higher transistor capacitances in differential amplifier D4, and this in turn results in a lower cut-off frequency of the arrangement. The introduction of noise blocks $\tau N$ into the connections of differential amplifier D4 with signal output ports A1 and A2 of the amplifier sketched in FIG. 3 is therefore of particular advantage. The noise of differential amplifier D4 is suppressed considerably and resistors R412 and R422 insulate signal output ports A1 and A2 against the capacitances of the noise blocks. Due to the fact that current JB4 is divided and fed back in the stabilization stage, the DC components in the push-pull output currents $JA1=J21+JB4/2$ and $JA2=J31+JB4/2$ remain approximately constant over a wide control range.

In the distributor stage, formed by differential amplifiers D9 and D10, output currents JA1 and JA2 are each divided into two equal components (corresponding to $\alpha V=0.5$) and fed to shared ports B5 to B8 of the mixers (FIG. 4). The uniform distribution can also be effected by way of resistors as shown in FIG. 4. The use of differential amplifiers D9 and D10 as shown in FIG. 7 provides better isolation of the mixers, but the noise contribution NV is also higher. The significant fact is that the signal to quiescent current ratio is not changed during the division in the distribution stage since all current components are reduced at the same ratio and thus the signal to quiescent current ratio in the mixer output signals is predetermined by the input stage and the control stage. In particular, the sum of the currents through both mixers MQ1 and MQ2 (FIG. 4) is available as the quiescent current.

The noise contributions NM of the mixers depend to a great extent on their operating state. During operation of the mixer in the switched mode with the base terminals being driven by rectangular signals, the interference components composed essentially of noise and intermodulation distortion from the mixers are low as a whole and are dependent on the edge steepness of the rectangular signals. Noticeable noise contributions are produced primarily at the moments of switching. If the mixers are operated linearly, the noise components are higher and no longer negligible.

The principle of cascading a transadmittance input amplifier, which converts an input voltage into an output current, with several parallel-connected mixers, can also be employed for amplifiers having only one current output. The advantage that linearity and noise behavior are determined essentially by the input stage and are not noticeably adversely influenced by the division is also applicable for this case. Furthermore, since only one input stage for several mixer stages would be required, operation of the input stage with a relatively higher quiescent current would be permitted while the power consumption as a whole of the cascaded arrangement would be justifiable. The mixers MQ1 and MQ2 with push-pull actuation by way of ports A1 and A2 would then be replaced, for example, by simple push-pull mixer stages each including only one differential amplifier.

It will be understood that the above description of the present invention is susceptible to various modifications, changes, and adaptations, and the same are intended to be comprehended within the meaning and range of equivalents of the appended claims.

What we claim is:

1. A controllable broadband amplifier for use with a power supply having first and second poles, the broadband amplifier having first and second signal input ports, first and second control voltage input ports, and first and second signal output ports, said broadband amplifier comprising:

an initial differential amplifier having first and second input ports, first and second output ports, and a shared port, the first input port of the initial differential amplifier being connected to the first signal input port of the broadband amplifier and the second input port of the initial differential amplifier being connected to the second signal input port of the broadband amplifier;

a constant current source connected between the shared port of the initial differential amplifier and the first pole of the power supply;

another differential amplifier having first and second input ports, first and second output ports, and a shared port, the first input port of the another differential amplifier being connected to the first control voltage input port of the broadband amplifier, the second input port of the another differential amplifier being connected to the second control voltage input port of the broadband amplifier, the shared port of the another differential amplifier being connected to the first output port of the initial differential amplifier, and the first output port of the another differential amplifier being connected to the first signal output port of the broadband amplifier;

an additional differential amplifier having first and second input ports, first and second output ports, and a shared port, and first input port of the additional differential amplifier being connected to the first control voltage input port of the broadband amplifier, the second input port of the additional differential amplifier being connected to the second control voltage input port of the broadband amplifier, the shared port of the additional differential amplifier being connected to the second output port of the initial differential amplifier, and the first output port of the additional differential amplifier being connected to the second signal output port of the broadband amplifier;

a further differential amplifier having first and second input ports, first and second output ports, and a shared port, the shared port of the further differential amplifier being connected to the second output port of the another differential amplifier and to the second output port of the additional differential amplifier;

a signal feed-out stage connecting the second pole of the power supply to the first and second signal output ports of the broadband amplifier; and a plurality of impedance elements connected in series between the first and second signal output ports of the broadband amplifier, the series of impedance elements having a center tap at which the resistance between the first signal output port of the broadband amplifier and the center tap is substantially equal to the resistance between the second signal output port of the broadband amplifier and the center tap, the first and second input ports of the further differential amplifier being connected to the center tap.

2. The broadband amplifier of claim 1, wherein the series of impedance elements comprises a resistor connected between the center tap and the first signal output port of the broadband amplifier, and another resistor connected between the center tap and the second signal output port of the broadband amplifier, and wherein the first output port of the further differential amplifier is connected to the first signal output port of the broadband amplifier and the second output port of the further differential amplifier is connected to the second signal output port of the broadband amplifier.

3. The broadband amplifier of claim 1, wherein each differential amplifier comprises a respective first transistor having an emitter, having a base which constitutes the first input port, and having a collector which constitutes the first output port, a respective second transistor having an emitter, having a base which constitutes the second input port, and having a collector which constitutes the second output port, and means for interconnecting the emitters to provide the shared port.

4. The broadband amplifier of claim 3, wherein the means for interconnecting the emitters in the initial differential amplifier comprises a resistor connecting the emitter of the first transistor to the shared port and a resistor connecting the emitter of the second transistor to the shared port.

5. The broadband amplifier of claim 3, wherein the means for interconnecting the emitters in the further differential amplifier comprises a resistor connecting the emitter of the first transistor to the shared port and a resistor connecting the emitter of the second transistor to the shared point.

6. The broadband amplifier of claim 1, wherein the series of impedance elements comprises a first resistor connected to the first signal output port of the broadband amplifier, a second resistor connected to the first resistor, at an intermediate connection point, a third resistor connected to the second resistor at the center tap, and a fourth resistor connected to the third resistor at another intermediate connection point, the fourth resistor additionally being connected to the second signal output port of the broadband amplifier, the first and fourth resistors having resistance values that are substantially equal and the second and third resistors having resistance values that are substantially equal, the first output port of the further differential amplifier being connected to the intermediate connection point between the first and second resistors and the second output port of the further differential amplifier being connected to the another intermediate connection point between the third and fourth resistors, and further comprising means including at least one capacitor for connecting the intermediate connection point between the first and second resistors to the another intermediate connection point between the third and fourth resistors.

7. The broadband amplifier of claim 6, wherein the means including at least one capacitor comprises a capacitor connecting the intermediate connection point between the first and second resistors to a reference potential, and a capacitor connecting the another intermediate connection point between the third and fourth resistors to the reference potential.

8. A mixer arrangement for use with a power supply having first and second poles, comprising:
a broadband amplifier having first and second signal input ports, first and second control voltage input ports, and first and second signal output ports, said broadband amplifier including
an initial differential amplifier having first and second input ports, first and second output ports, and a shared port, the first input port of the initial differential amplifier being connected to the first signal input port of the broadband amplifier and the second input port of the initial differential amplifier being connected to the second signal input port of the broadband amplifier,
a constant current source connected between the shared port of the initial differential amplifier and the first pole of the power supply,
another differential amplifier having first and second input ports, first and second output ports, and a shared port, the first input port of the another differential amplifier being connected to the first control voltage input port of the broadband amplifier, the second input port of the another differential amplifier being connected to the second control voltage input port of the broadband amplifier, the shared port of the another differential amplifier being connected to the first output port of the initial differential amplifier, and the first output port of the another differential amplifier being connected to the first signal output port of the broadband amplifier, an additional differential amplifier having first and second input ports, first and second output ports, and a shared port, the first input port of the additional differential amplifier being connected to the first control voltage input port of the broadband amplifier, the second input port of the additional differential amplifier being connected to the second control voltage input port of the broadband amplifier, the shared port of the additional differential amplifier being connected to the second output port of the initial differential amplifier, and the first output port of the additional differential amplifier being connected to the second signal output port of the broadband amplifier, a further differential amplifier having first and second input ports, first and second output ports, and a shared port, the shared port of the further differential amplifier being connected to the second output port of the another differential amplifier and to the second output port of the additional differential amplifier, and a plurality of impedance elements connected in series between the first and second signal output ports of the broadband amplifier, the series of impedance elements having a center tap at which the resistance between the first signal output port of the broadband amplifier and the center tap is substantially equal to the resistance between the second signal output port of the broadband amplifier and the center tap, the first and second input ports of the further differential amplifier being connected to the center tap; and mixer means, connecting the second pole of the power supply to the first and second signal output ports of the broadband amplifier, for converting an input signal amplified by the broadband amplifier and at least one local oscillator signal, wherein the mixer means requires operating currents and the currents through the first and second signal output ports of the broadband amplifier constitute the operating currents for the mixer means.

9. The mixer arrangement of claim 8, wherein the mixer means comprises a four-quadrant multiplier having first and second local oscillator signal input ports and having first and second mixed signal output ports, the four-quadrant multiplier including an initial mixer differential amplifier having first and second input ports, first and second output ports, and a shared port, the first input port of the initial mixer differential amplifier being connected to the first local oscillator signal input port, the second input port of the initial mixer differential amplifier being connected to the second local oscillator signal input port, the first output port of the initial mixer differential amplifier being connected to the first mixed signal output port, and the second output port of the initial mixer differential amplifier being connected to the second mixed signal output port;

another mixer differential amplifier having first and second input ports, first and second output ports, and a shared port, the first input port of the another mixer differential amplifier being connected to the first local oscillator signal input port, the second input port of the another mixer differential amplifier being connected to the second local oscillator signal input port, the first output port of the another mixer differential amplifier being connected to the second mixed signal output port, and the second output port of the another mixer differential amplifier being connected to the first mixed signal output port;

signal feed-out stages connecting the second pole of the power supply to the first and second mixed signal output ports; and means for connecting the shared port of the initial mixer differential amplifier to the second signal output port of the broadband amplifier and for connecting the shared port of the another mixer differential amplifier to the first signal output port of the broadband amplifier.

10. The mixer arrangement of claim 9, wherein the means for connecting comprises an initial mixer resistor connecting the shared port of the initial mixer differential amplifier to the second signal output port of the broadband amplifier, and another mixer resistor connecting the shared port of the another mixer differential amplifier to the first signal output port of the broadband amplifier, the initial mixer resistor and the another mixer resistor having substantially equal resistance values.

11. The mixer arrangement of claim 9, wherein the mixer means additionally comprises an additional four-quadrant multiplier having first and second local oscillator signal input ports and having first and second mixed signal output ports, the additional four-quadrant multiplier including an additional mixer differential amplifier having first and second input ports, first and second output ports, and a shared port, the first input port of the additional mixer differential amplifier being connected to the first local oscillator signal input port of the additional four-quadrant multiplier, the second input port of the additional mixer differential amplifier being connected to the second local oscillator signal input port of the additional four-quadrant multiplier, the first output port of the additional mixer differential amplifier being connected to the first mixed signal output port of the additional four-quadrant multiplier, and the second output port of the additional mixer differential amplifier being connected to the second mixed signal output port of the additional four-quadrant multiplier;

a further mixer differential amplifier having first and second input ports, first and second output ports, and a shared port, the first input port of the further mixer differential amplifier being connected to the first local oscillator signal input port of the additional four-quadrant multiplier, the second input port of the further mixer differential amplifier being connected to the second local oscillator signal input port of the additional four-quadrant multiplier, the first output port of the further mixer differential amplifier being connected to the second mixed signal output port of the additional four-quadrant multiplier, and the second output port of the further mixer differential amplifier being connected to the first mixed signal output port of the additional four-quadrant; and additional signal feed-out stages connecting the second pole of the power supply to the first and second mixed signal output ports of the additional four-quadrant multiplier, and wherein the means for connecting additionally includes means for connecting the shared port of the additional mixer differential amplifier to the second signal output port of the broadband amplifier and for connecting the shared port of the further mixer differential amplifier to the first signal output port of the broadband amplifier.

12. The mixer arrangement of claim 11, wherein the means for connecting comprises a differential amplifier having a first output port which is connected to the shared port of the initial mixer differential amplifier, having a second output port which is connected to the shared port of the additional mixer differential amplifier, and having a shared port which is connected to the second signal output port of the broadband amplifier, and a differential amplifier having a first output port which is connected to the shared port of the another mixer differential amplifier, having a second output port which is connected to the shared port of the further mixer differential amplifier, and having a shared port which is connected to the first signal output port of the broadband amplifier.

13. The mixer arrangement of claim 8, wherein the mixing means is a quadrature mixer stage which receives a pair of identical local oscillator signals, except that one of the local oscillator signals is shifted in phase by 90°.

14. The mixer arrangement of claim 8, wherein the mixer means comprises two push-pull mixers, each push-pull mixer including a respective differential amplifier having a shared port, and means for connecting the shared port to one of the first and second signal output ports of the broadband amplifier.

15. The mixer arrangement of claim 8, wherein the mixer means operates in a switched mode.

* * * * *

UNITED STATES PATENT AND TRADEMARK OFFICE
CERTIFICATE OF CORRECTION

PATENT NO. : 4,931,746

DATED : June 5, 1990

INVENTOR(S) : Tränkle et al

It is certified that error appears in the above-identified patent and that said Letters Patent is hereby corrected as shown below:

On the title page:

In the heading of the patent, under [30] Foreign Application Priority Data, the German priority application number should be --3816075.

Signed and Sealed this

Twenty-third Day of July, 1991

Attest:

*Attesting Officer*

HARRY F. MANBECK, JR.

*Commissioner of Patents and Trademarks*